US007173479B2

(12) United States Patent
Suematsu

(10) Patent No.: US 7,173,479 B2
(45) Date of Patent: Feb. 6, 2007

(54) SEMICONDUCTOR INTEGRATED CIRCUIT DEVICE

(75) Inventor: Yasuhiro Suematsu, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/962,617

(22) Filed: Oct. 13, 2004

(65) Prior Publication Data

US 2005/0116696 A1 Jun. 2, 2005

(30) Foreign Application Priority Data

Oct. 17, 2003 (JP) ............................ 2003-357943

(51) Int. Cl.
*G05F 3/02* (2006.01)

(52) U.S. Cl. ...................................... 327/537; 327/536

(58) Field of Classification Search ................ 327/535, 327/536, 537; 363/59, 60
See application file for complete search history.

(56) References Cited

U.S. PATENT DOCUMENTS

| | | | | |
|---|---|---|---|---|
| 5,159,543 | A * | 10/1992 | Yamawaki | 363/60 |
| 5,969,565 | A * | 10/1999 | Naganawa | 327/536 |
| 6,285,622 | B1 * | 9/2001 | Haraguchi et al. | 365/226 |
| 6,297,687 | B1 * | 10/2001 | Sugimura | 327/536 |
| 6,356,499 | B1 * | 3/2002 | Banba et al. | 365/226 |
| 6,429,725 | B1 * | 8/2002 | Tanzawa et al. | 327/536 |
| 6,717,458 | B1 * | 4/2004 | Potanin | 327/536 |
| 6,798,274 | B2 * | 9/2004 | Tanimoto | 327/536 |
| 2005/0110560 | A1 * | 5/2005 | Kim et al. | 327/536 |

FOREIGN PATENT DOCUMENTS

| | | |
|---|---|---|
| JP | 11-265578 | 9/1999 |
| JP | 2000-30437 | 1/2000 |
| JP | 2000-339958 | 12/2000 |
| JP | 2001-126478 | 5/2001 |
| JP | 2001-283593 | 10/2001 |

* cited by examiner

*Primary Examiner*—Long Nguyen
*Assistant Examiner*—Ryan Jager
(74) *Attorney, Agent, or Firm*—Oblon, Spivak, McClelland, Maier & Neustadt, P.C.

(57) ABSTRACT

A semiconductor integrated circuit device according to a first aspect of the present invention includes: a first internal power source voltage generating circuit which includes a voltage boosting circuit and a level determining circuit, and outputs a first internal power source voltage, the voltage boosting circuit boosting a voltage based upon a voltage boosting start instruction signal after putting on a power supply, and the level determining circuit which generates a first control signal when an output voltage from the voltage boosting circuit reaches a first level and generates a second control signal for stopping the voltage boosting of the voltage boosting circuit when the output voltage from the voltage boosting circuit reaches a second level higher than the first level; a first control circuit which generates a first action start instruction signal based upon the voltage boosting start instruction signal and the first control signal; and a second internal power source voltage generating circuit which generates a second internal power source voltage based upon the first action start instruction signal.

14 Claims, 17 Drawing Sheets

4
4a
VPPGO
VOLTAGE BOOSTING CIRCUIT
VPP
VPP POWER SOURCE LINE
VCC,VSS
VPPLIMIT2
LEVEL DETERMINING CIRCUIT
VREF
TO CONTROL CIRCUIT
VPPLIMIT1
4b

SEMICONDUCTOR INTEGRATED CIRCUIT DEVICE

CROSS-REFERENCE TO RELATED APPLICATION

This application is based upon and claims the benefit of priority from prior Japanese Patent Application No. 2003-357943 filed on Oct. 17, 2003 in Japan, the entire contents of which are incorporated herein by reference.

BACKGROUND OF THE INVENTION

1. Field of the Invention

The present invention related to a semiconductor integrated circuit device and in particular to a semiconductor integrated circuit device provided therein with a plurality of internal power source voltage generating circuits.

2. Related Art

In recent years, a semiconductor memory has a plurality of internal power source voltage generating circuits mounted on a semiconductor chip. When all the internal power source voltage generating circuits mounted are simultaneously actuated at a time of power supply to the chip, peak current of about several hundreds mA is generated. In order to prevent such large current from being generated, an approach where generation of such peak current is suppressed by activating the internal power source voltage generating circuits individually or by grouping these circuits into small members to activate them for each group at a time of power supply has been employed.

In order to activate a plurality of internal power source voltage generating circuits individually or divide these circuits into small groups to activate them for each group, a control circuit which actuates respective internal power source voltage generating circuits in a predetermined actuation order must be provided. The control circuit requires an output signal of a level determining circuit which determines whether or not output voltages of individual internal power source voltage generating circuits have reached an expected value, (makes determination about acceptance or rejection of a set completion) and it is constituted so as to activate, when the determination is affirmative (namely when each internal power source voltage generating circuit has reached the expected value), the next internal power source voltage generating circuit.

For example, a configuration of a conventional semiconductor integrated circuit device having a plurality of internal power source voltage generating circuits is shown in FIG. 8. The conventional semiconductor integrated circuit device is a semiconductor memory, and is provided with a plurality of internal power source voltage generating circuits, namely, a VPP generating circuit 5, a VBLH generating circuit 6, and a VBB generating circuit 8. The internal power source voltage generating circuits are inputted with a reference voltage VREF generated from a VREF generating circuit 2, power source voltages VCC and VSS (not shown) inputted externally of a semiconductor chip.

A voltage VPP generated from the VPP generating circuit 5 is used for driving a word line, a voltage VBLH generated from the VBLH generating circuit 6 is a potential indicating "H" level of a bit line, and a voltage VBB generated from the VBB generating circuit 8 is used as a substrate voltage.

The VREF generating circuit 2 generates a reference voltage VREF when power source voltages VCC and VSS are applied to the semiconductor chip. A VCCON signal generating circuit 10 outputs a signal VCCON which reaches "H" level when the power source voltages VCC and VSS are applied to the semiconductor chip and the power source voltage VCC reaches a predetermined level (for example, 1.5V). A VREF timer 12 operates based upon the signal VCCON, and outputs a signal VPPGO which changes to "H" level when a level of the reference voltage VREF becomes stable.

As shown in FIG. 9, the VPP generating circuit 5 is provided with a voltage boosting circuit 5*a* and a level determining circuit 5*b*. The voltage boosting circuit 5*a* performs a voltage boosting action based upon the signal VPPGO and an output signal VPPLIMIT of the level determining circuit 5*b* to generate a voltage VPP. The level determining circuit 5*b* operates based upon the reference voltage VREF and the output voltage VPP of the voltage boosting circuit 5*a* and generates a control signal VPPLIMIT that changes to "H" level when the voltage VPP reaches an expected value.

A specific configuration of the level determining circuit 5*b* is shown in FIG. 10. The level determining circuit 5*b* is provided with resistors 61 and 62 connected serially, capacitors 63 and 65, a current mirror circuit 64, and inverters 66 and 67. The resistor 61 receives a voltage VPP at one end thereof, and the other end thereof is connected to one end of the resistor 62. The other end of the resistor 62 is connected to a power source VSS. Such design is employed that a ratio of a resistance value of the resistor 61 to that of the resistor 62 is 22:13, for example. This is for setting a potential VPPVREF at a connection point of the resistor 61 and the resistor 62, namely, a divided voltage to 1.3V, when the voltage VPP is 3.5V.

The current mirror circuit 64 is constituted of P-channel transistors P1 and P2, and N-channel transistors N1, N2, and N3. The gate of the transistor N1 is applied with a divided voltage VPPVREF and the gate of the transistor N2 is applied with a reference voltage VREF. The gate of the transistor N1 is connected with the capacitor 63, and the gate of the transistor N2 is connected with the capacitor 65. The capacitors 63 and 65 are provided for suppressing vibrations of levels of the divided voltage VPPVREF and the reference voltage VREF.

The inverters 66 and 67 are connected in series, and they receive a voltage of a connection node of the transistor P2 and the transistor N2 in the current mirror circuit 64 so that the inverter 67 outputs a control signal VPPLIMIT. When the voltage VPP exceeds 3.5V, VPPVREF>VREF, the control signal VPPLIMIT changes from "L" level to "H" level. When the control signal VPPLIMIT changes to "H" level, the voltage boosting circuit 5*a* stops its voltage boosting action.

Thus, when the control signal VPPLIMIT generated from the VPP generating circuit 5 becomes "H" level, because the VPPGO signal is also in "H" level, a control circuit 14 operates to feed a control signal VBLHGO whose level has changed to "H" level to the VBLH generating circuit 6 and the control circuit 16, as shown in FIG. 8. A specific configuration of the control circuit 14 is shown in FIG. 11. The specific control circuit 14 is provided with an inverter 71, cross-connected NAND circuits 72 and 73, and an inverter 74. The control signal VPPGO is inputted into the NAND circuit 72, and the control signal VPPLIMIT is inputted into the NAND circuit 73 via the inverter 71. An output of the NAND circuit 72 serves as the control signal VBLHGO via the inverter 74. An operation of the control circuit 14 is shown in FIG. 12. As understood from the above explanation and the description in FIG. 12, the control signal VPPGO first becomes "H" level. Thereafter, when the control signal VPPLIMIT becomes "H" level, the control circuit 14 operates so that the control signal VBLHGO becomes "H" level.

When the control signal VBLHGO whose level has changed to "H" is inputted, as shown in FIG. 8, the VBLH generating circuit 6 operates to generate a voltage VBLH, and when the voltage VBLH reaches an expected value, a control signal VBLHLIMIT generated from the VBLH generating circuit changes to "H" level. As a result, the control circuit 16 operates to change the level of the control signal VBBGO from "L" to "H". The control signal VBBGO changed to "H" level is feed out to the VBB generating circuit 8 and a control circuit 18. The VBB generating circuit 8 operates based upon the control signal VBBGO changed to "H" level to generate a voltage VBB. When the voltage VBB reaches an expected value, the control signal VBBLIMIT fed from the VBB generating circuit 8 to the control circuit 18 changed to "H" level and the control circuit 18 operates to output a control signal CHRDY showing completion of preparation of the semiconductor chip.

Waveforms of various voltages at a time of power application to the semiconductor memory shown in FIG. 8 are shown in FIG. 13. When power is applied to the semiconductor memory, first, the voltage VCC rises and the reference voltage VREF also increases. When the voltage VCC reaches a predetermined level, a VCCON signal also rises rapidly and the levels of the voltage VCC and the VCCON signal become constant levels (for example, 2.5V). Thereafter, a VPPGO signal rises so that a voltage VPP is produced to rise rapidly. Thereafter, a voltage VBLH is produced to rise rapidly. After the voltage VBLH rises, a voltage VBB is produced to reach a predetermined value. As a result, the control signal CHRDY changes to "H" level. In FIG. 13, after the VPPGO, VCC, VCCON, and CHRDY rise, they become constant values (for example, VCC=2.5V).

Thus, the internal power source voltage generating circuits of the conventional semiconductor integrated circuit device are constituted in a circuit of a self-matching type to compare the reference potential VREF always produced in the chip and each internal power source voltage level (an expected value) with each other to perform a level adjustment automatically. Therefore, various internal power source voltage values expected during an ordinary operation after source supplying are set in the level determining circuit. Conventionally, the control circuit at a time of power supplying is operated based upon an output of the level determining circuit.

Though a low voltage in power source voltage VCC for a semiconductor memory advances, set values for internal power source voltages are not so decreased. Particularly, it is difficult for the power source VPP for driving word lines produced in the voltage boosting circuit to operate at an allowable minimum value VCCmin of the power source voltage due to a structure of the circuit. For example, when a product with a power source VPP of 3.5V is fabricated with a product with a power source voltage VCC of 2.5V, a voltage boosting circuit with a one-stage constitution is used, but the voltage boosting circuit can not produce a voltage exceeding a voltage of VCC (2.5V)×2 theoretically. In fact, an operation guaranteed range for a device is defined in addition to a guaranteed range for an operation speed. In view of such a fact, it is necessary to produce VPP=3.5 V near VCC=2.1 V. Such a value will not cause any problem to a circuit operation theoretically.

However, when the power source voltage VCC is the allowable minimum value VCCmin, such a case occurs that a voltage VPP at a time of power application can not exceed a circuit threshold of the level determining circuit 5*b*. This means that a reference voltage VREF produced in a chip becomes higher than a design expected value due to a manufacturing process. As understood from FIG. 10, when the reference voltage VREF becomes high like this case, since a circuit threshold of the level determining circuit 5*b* increases, the voltage boosting circuit 5*a* must output a voltage VPP with a higher level. In this case, the voltage boosting circuit may be required to operate to output a voltage exceeding an operation limit value at the allowable minimum value VCCmin, namely, a limit value of a voltage produced based upon the allowable minimum value VCCmin. When the voltage boosting circuit is required for an operation for outputting a voltage exceeding the operation limit value at the allowable minimum value VCCmin, the control signal VPPLIMIT does not change to "H" level for all time, and the control circuit 14 does not proceed to a normal operation. Accordingly, the semiconductor chip is put in a non-normal operation at a time of power application.

Such a fact is unavoidable that the level of the reference voltage VREF fluctuates due to a manufacturing process, and a problem about the fluctuation is solved by adjusting the level of the allowable minimum value VCCmin using a fuse circuit or the like. However, in the semiconductor memory, the level adjustment using a fuse circuit is performed when a memory cell is replaced with a redundant cell. Therefore, when the level of the reference voltage VREF fluctuates due to a manufacturing process, a level evaluation to the allowable minimum value VCCmin is once stopped, and determination about good/bad of the memory cell is made. Then, after the level of the VCCmin is adjusted using a fuse circuit or the like, the level evaluation to the VCCmin is performed again. Therefore, there is a problem that the number of evaluation steps increases, which results in increase in evaluation time and rise in manufacturing cost.

SUMMARY OF THE INVENTION

A semiconductor integrated circuit device according to a first aspect of the present invention includes: a first internal power source voltage generating circuit which includes a voltage boosting circuit and a level determining circuit, and outputs a first internal power source voltage, the voltage boosting circuit boosting a voltage based upon a voltage boosting start instruction signal after putting on a power supply, and the level determining circuit which generates a first control signal when an output voltage from the voltage boosting circuit reaches a first level and generates a second control signal for stopping the voltage boosting of the voltage boosting circuit when the output voltage from the voltage boosting circuit reaches a second level higher than the first level; a first control circuit which generates a first action start instruction signal based upon the voltage boosting start instruction signal and the first control signal; and a second internal power source voltage generating circuit which generates a second internal power source voltage based upon the first action start instruction signal.

A semiconductor integrated circuit device according to a second aspect of the present invention includes: a first internal power source voltage generating circuit which includes a voltage boosting circuit and a level determining circuit, and outputs a first internal power source voltage, the voltage boosting circuit boosting a voltage based upon a voltage boosting start instruction signal after putting a power supply, and the level determining circuit which generates a first control signal when an output voltage of the voltage boosting circuit reaches a first level to stop a voltage boosting of the voltage boosting circuit; a first control circuit which generates a first action start instruction signal based upon the voltage boosting start instruction signal; a second internal power source voltage generating circuit which generates a second internal power source voltage based upon the first action start instruction signal; a second control circuit which generates a second action start instruction signal when the second internal power source voltage generated from the second internal power source voltage generating circuit reaches a second level; a third internal power source voltage generating circuit which generates a third internal power source voltage based upon the second action start instruction signal; and a third control circuit which generates a third action start instruction signal when the third internal power source voltage generated from the third internal power source voltage generating circuit reaches a third level.

DETAILED DESCRIPTION OF THE INVENTION

Embodiments of the present invention will be explained below with reference to the drawings.

First Embodiment

Figure 2:
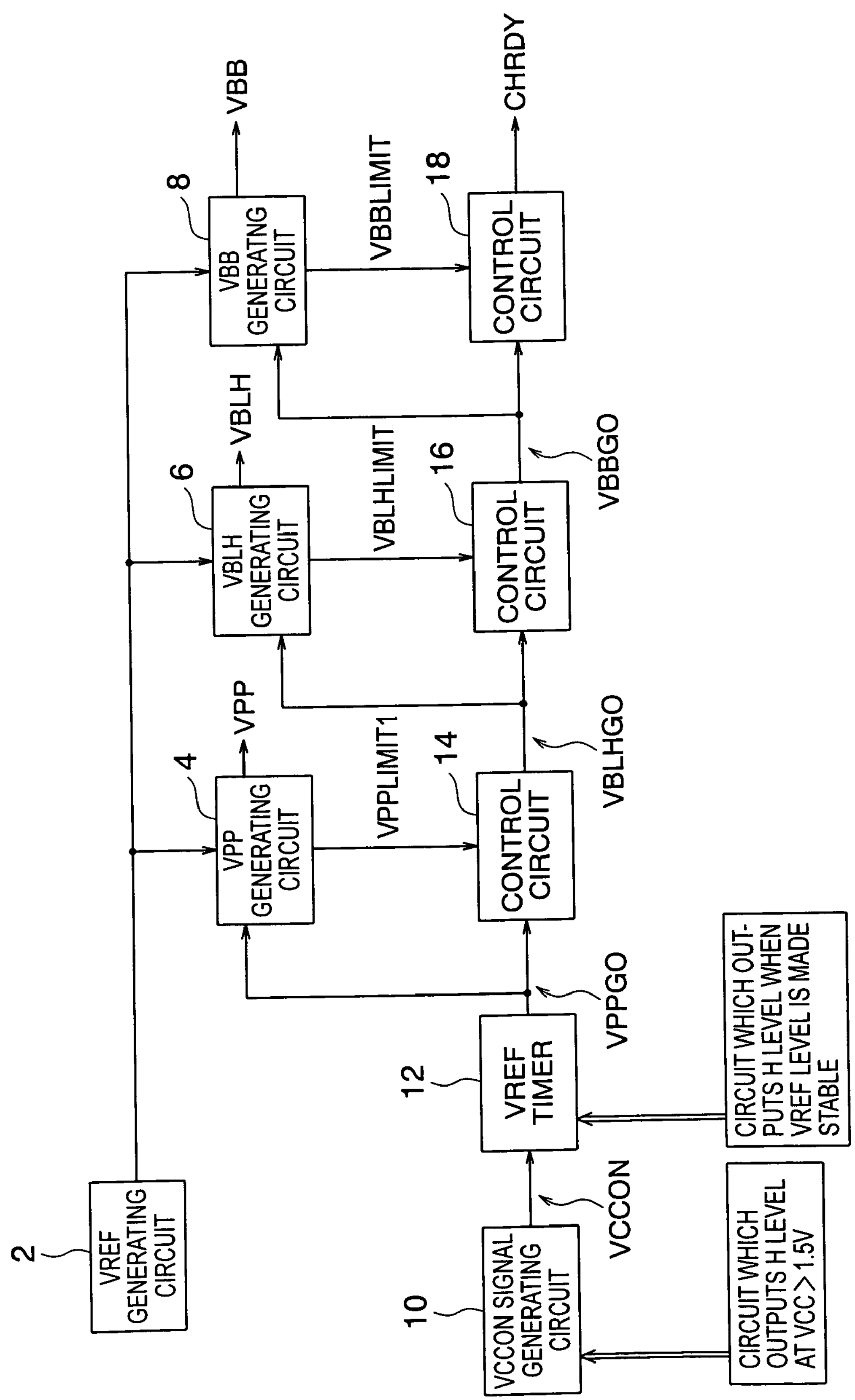
FIG. 2 is a block diagram showing a configuration of the semiconductor integrated circuit device according to the first embodiment of the invention.
Figure 8:
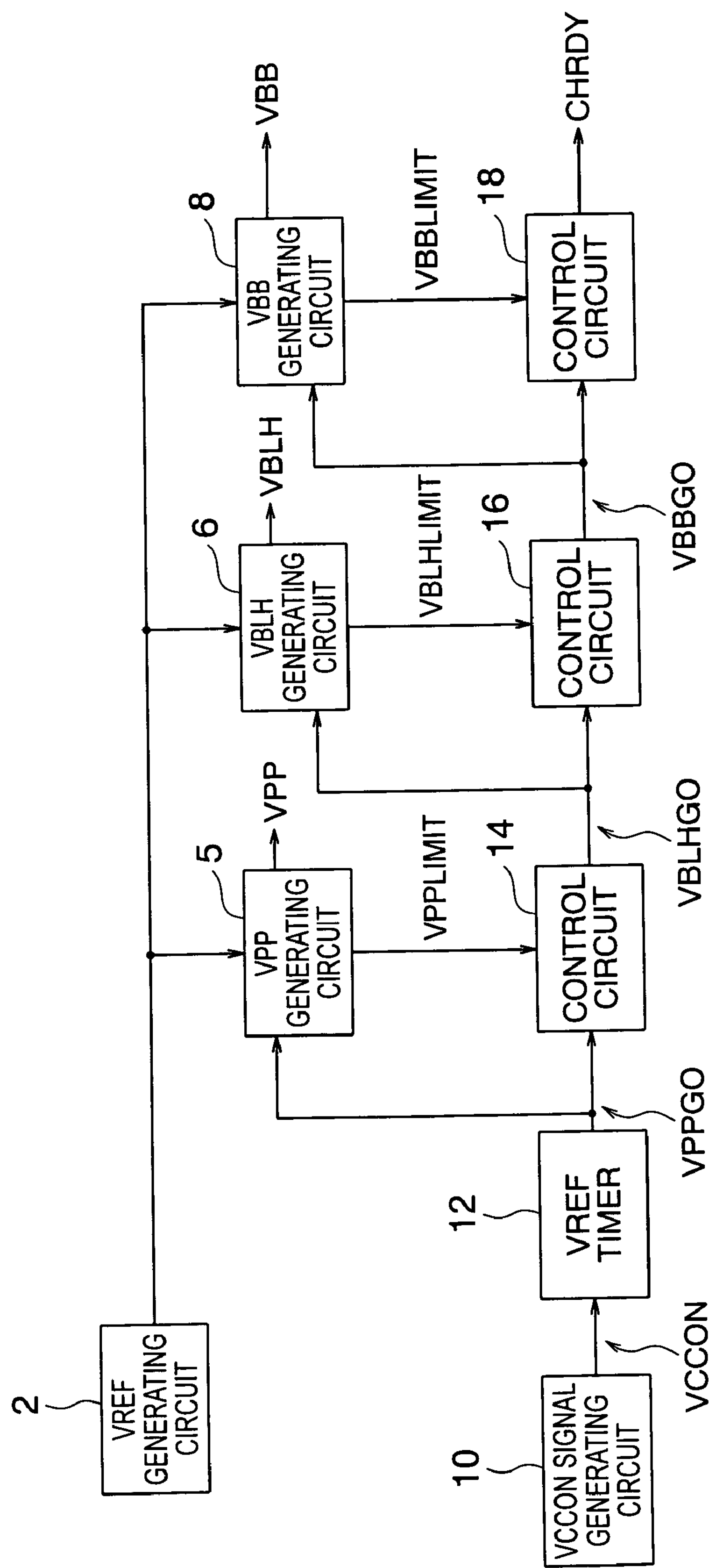
FIG. 8 is a block diagram showing a configuration of a conventional semiconductor integrated circuit device.
Figure 9:
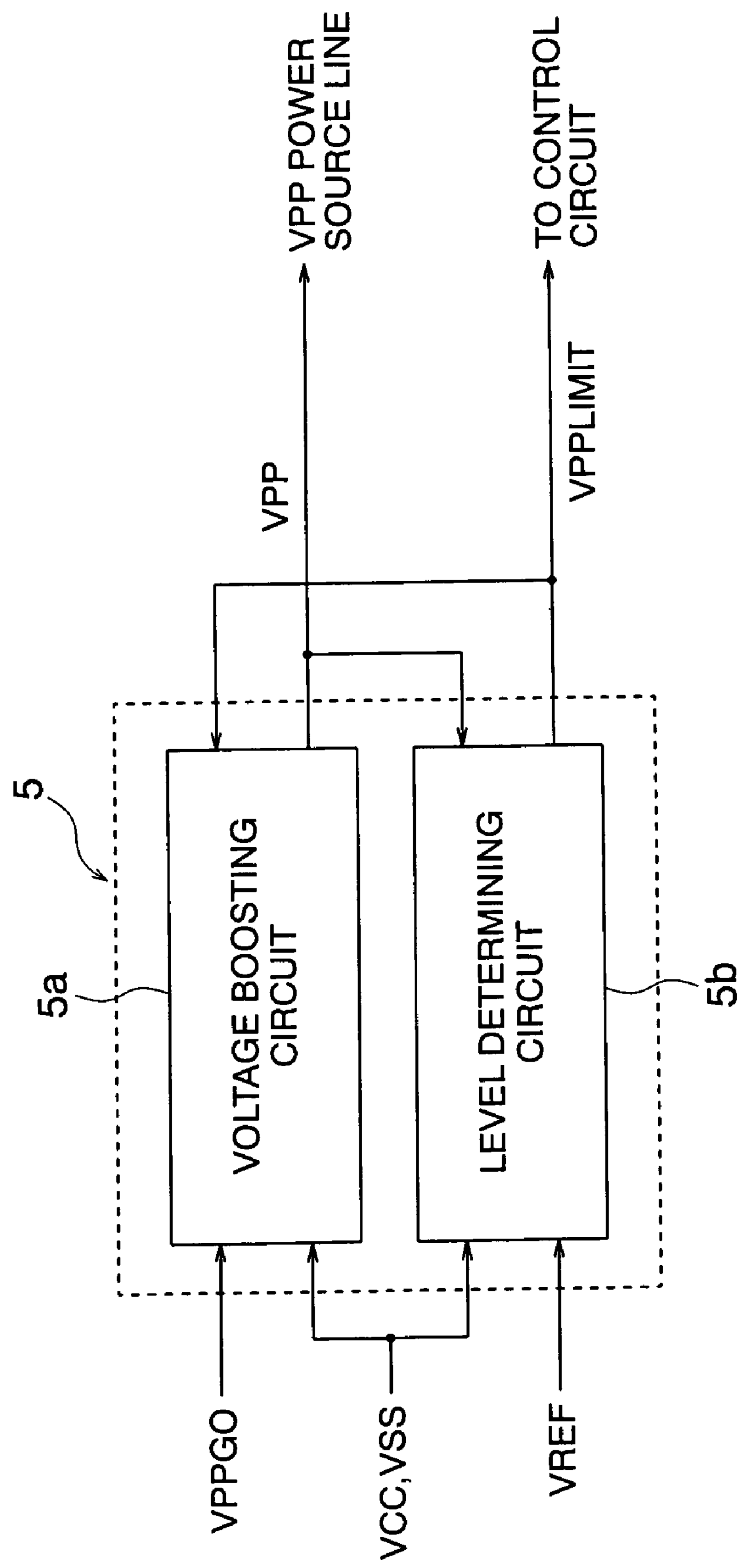
FIG. 9 is a block diagram showing a configuration of a VPP generating circuit of the conventional semiconductor integrated circuit device.
Figure 10:
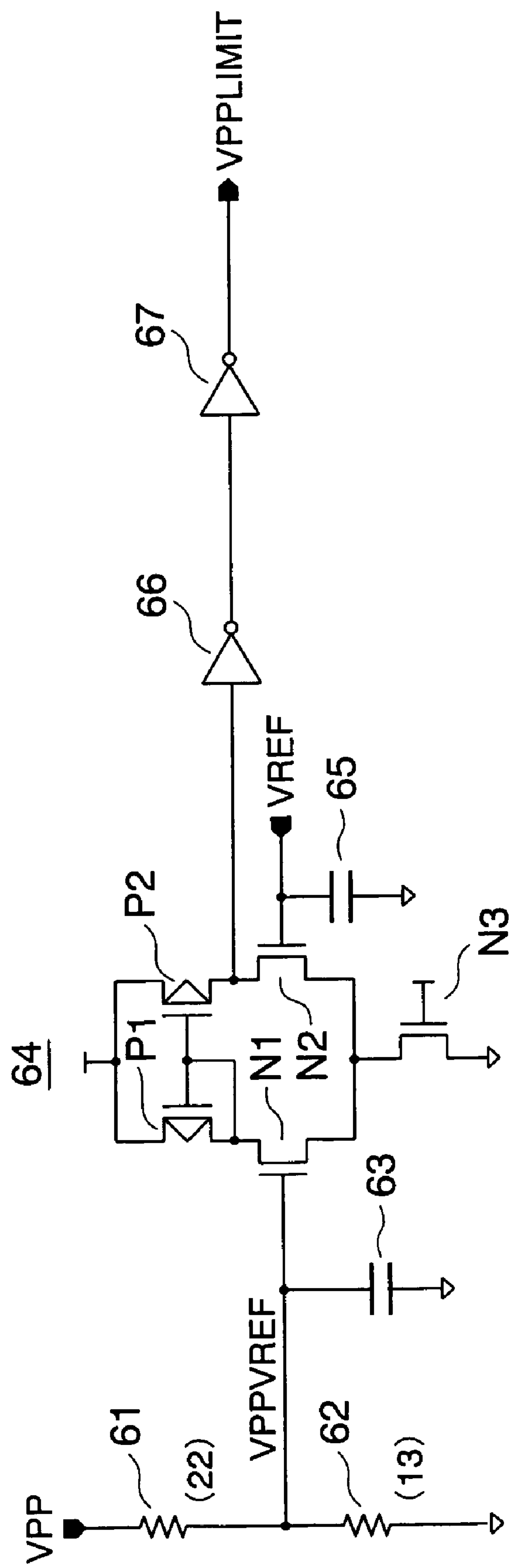
FIG. 10 is a circuit diagram showing a configuration of a conventional level determining circuit.

A configuration of a semiconductor integrated circuit device according to a first embodiment of the present invention is shown in FIG. 2. The semiconductor integrated circuit device according to the embodiment is a semiconductor memory, and is provided with a VREF generating circuit 2, a VPP generating circuit 4, a VBLH generating circuit 6, a VBB generating circuit 8, a VCCON signal generating circuit 10, a VREF timer 12, and control circuits 14, 16 and 18. That is, the semiconductor integrated circuit device according to this embodiment has a configuration that the VPP generating circuit 5 is replaced with the VPP generating circuit 4 in the conventional semiconductor integrated circuit device shown in FIG. 8. Therefore, the semiconductor integrated circuit device according to this embodiment is provided with a plurality of internal power source voltage generating circuits, namely, the VPP generating circuit 5, the VBLH generating circuit 6, and the VBB generating circuit 8. The internal power source voltage generating circuits are inputted with a reference voltage VREF generated from the VREF generating circuit 2, and power source voltages VCC and VSS (not shown) inputted externally of a semiconductor chip.

Figure 1:
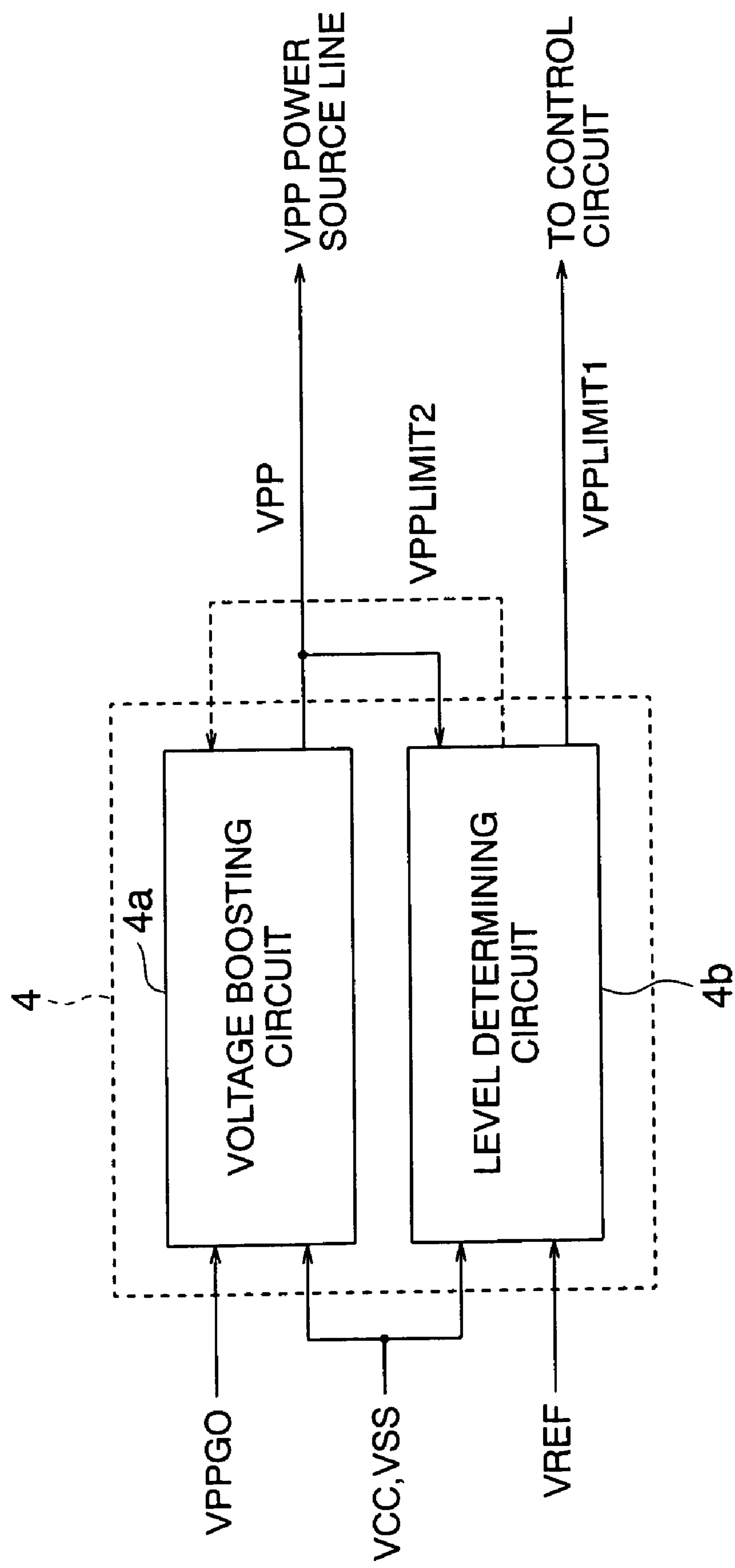
FIG. 1 is a block diagram showing a configuration of a VPP generating circuit in a semiconductor integrated circuit device according to a first embodiment of the present invention.

A configuration of the VPP generating circuit 4 is shown in FIG. 1. The VPP generating circuit 4 is provided with a voltage boosting circuit 4*a* and a level determining circuit 4*b*. The voltage boosting circuit 4*a* performs a voltage boosting operation based upon an output signal VPPGO of the VREF timer 12 and an output signal VPPLIMIT2 of the level determining circuit 4*b* to generate a voltage VPP. The level determining circuit 4*b* operates based upon the reference voltage VREF and the output voltage VPP of the voltage boosting circuit 4*a* to generate a control signal VPPLIMIT1 which changes to "H" level when the voltage VPP of the voltage boosting circuit 4*a* reaches a first expected value and feed the same to the control circuit 14. Further, the level determining circuit 4*b* generates a control signal VPPLIMIT2 which changes to "H" level when the voltage VPP of the voltage boosting circuit 4*a* reaches a second expected value higher than the first expected value to feed the same to the voltage boosting circuit 4*a*. Incidentally, the voltage boosting action performed by the voltage boosting circuit 4*a* stops when the control signal VPPLIMIT2 changes to "H" level.

Figures 3A, 3B:
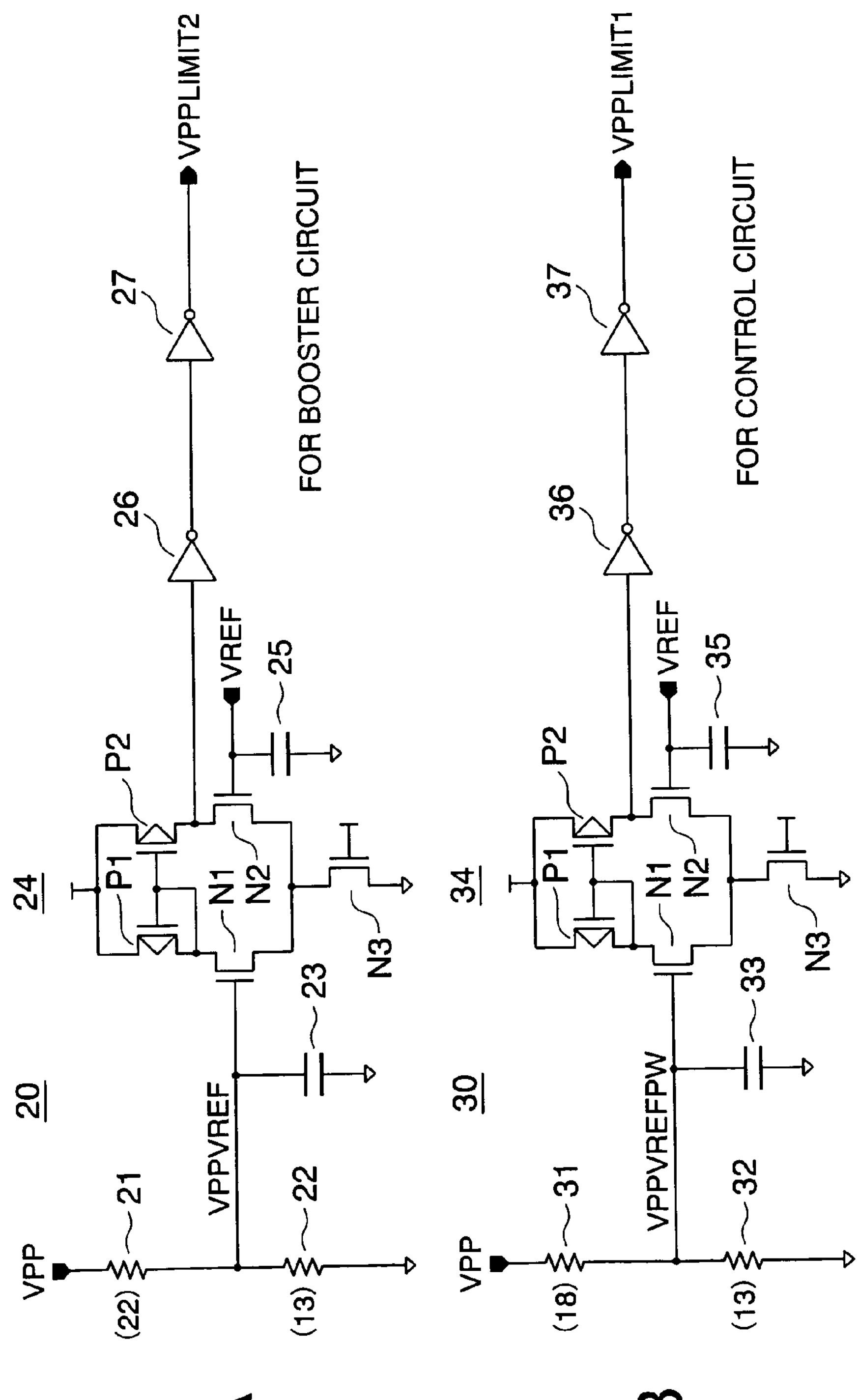
FIG. 3A is a circuit diagram showing a configuration of one specific example of a level determining circuit for a voltage boosting circuit according to the first embodiment.
FIG. 3B is a circuit diagram showing a configuration of one specific example of a level determining circuit for a control circuit according to the first embodiment.

A specific configuration of the level determining circuit 4*b* is shown in FIGS. 3A and 3B. The level determining circuit 4*b* is provided with two kinds of level determining circuits 20 and 30 for a voltage boosting circuit and for a control circuit. The level determining circuit 20 for a voltage boosting circuit and the level determining circuit 30 for a control circuit are shown in FIG. 3A and FIG. 3B, respectively.

As shown in FIG. 3A, the level determining circuit 20 for a voltage boosting circuit is provided with resistors 21 and 22 connected serially, capacitors 23 and 25, a current mirror circuit 24, and inverters 26 and 27. The resistor 21 receives a VPP voltage at one end thereof and the other end thereof is connected to one end of the resistor 22. The other end of the resistor 22 is connected to the power source VSS. Such design may be employed that a ratio of a resistance value of the resistor 21 to that of the resistor 22 is, for example, 22:13. This is for, when the VPP voltage is 3.5V, setting a potential VPPVREF at a connection point of the resistor 21 and the resistor 22, namely, a divided voltage, to 1.3V. The current mirror circuit 24 is constituted of P-channel transistors P1 and P2 and N-channel transistors N1, N2, and N3. The divided voltage VPPVREF is applied to the gate of the transistor N1 and the reference voltage VREF is applied to the gate of the transistor N2. Incidentally, the gate of the transistor N1 is connected with the capacitor 23 and the gate of the transistor N2 is connected with the capacitor 25. The capacitors 23 and 25 are provided for suppressing vibrations of the levels of the divided voltage VPPVREF and the reference voltage VREF. The inverters 26 and 27 are connected serially to receive a voltage at a connection node of the transistor P2 and the transistor N2 in the current mirror circuit 24, thereby outputting a control signal VPPLIMIT2 from the inverter 27. When the voltage VPP exceeds 3.5V, the divided voltage VPPVREF becomes more that the reference voltage VREF, i.e., VPPVREF>VREF, so that the control signal VPPLIMIT2 changes from "L" level to "H" level.

As shown in FIG. 3B, the level determining circuit 30 for a control circuit is provided with resistors 31 and 32 connected serially, capacitors 33 and 35, a current mirror circuit 34, and inverters 36 and 37. The resistor 31 receives the voltage VPP at one end thereof and the other end thereof is connected to one end of the resistor 32. The other end of the resistor 32 is connected to the power source VSS. Such design may be employed that a ratio of a resistance value of the resistor 31 to that of the resistor 32 is, for example, 18:13. This is because the level determining circuit 30 for a control circuit operates at an expected value lower than an expected value (that is, the value (=1.3V) of the potential VPPVREF obtained when the voltage VPP is 3.5V)) of the level determining circuit 20 for a voltage boosting circuit. The current mirror circuit 34 is constituted of P-channel transistors P1 and P2 and N-channel transistors N1, N2, and N3. The gate of the transistor N1 is applied with a divided voltage VPPVREFPW and the gate of the transistor N2 is applied with the reference voltage VREF. Incidentally, the gate of the transistor N1 is connected with the capacitor 33 and the gate of the transistor N2 is connected with the capacitor 35. The capacitors 33 and 35 are provided for suppressing vibrations of levels of the divided voltage VPPVREFPW and the reference voltage VREF. The inverters 36 and 37 are connected serially to receive a voltage at a connection node of the transistor P2 and the transistor N2 in the current mirror circuit 34, thereby outputting a control signal VPPLIMIT1 from the inverter 37. The voltage VPP has a value smaller than 3.5V and the divided voltage VPPVREFPW becomes larger than the reference voltage VREF, i.e., VPPVREFPW>VREF, so that the control signal VPPLIMIT1 changes from "L" level to "H" level.

Figure 4:
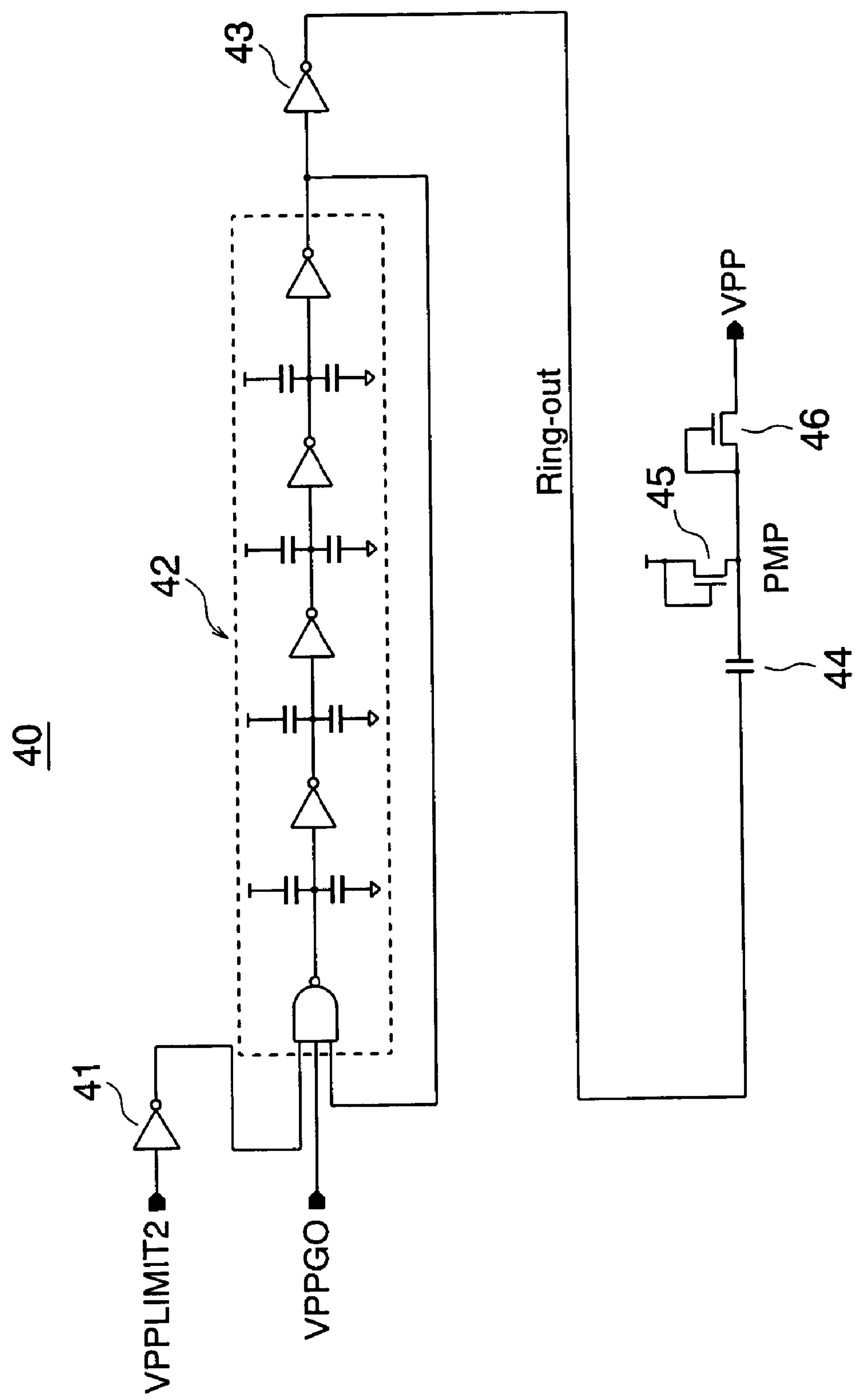
FIG. 4 is a circuit diagram showing a configuration of one specific example of the voltage booster circuit according to the first embodiment.

A configuration of one specific example of the voltage boosting circuit 4*a* is shown in FIG. 4. A voltage boosting circuit 40 of the specific example is provided with an inverter 41 which inverts a control signal VPPLIMIT2, a ring oscillator 42, an inverter 43 which inverts an output of the ring oscillator 42, a capacitor 44, and N-channel transistors 45 and 46. The ring oscillator 42 is provided with an NAND circuit which receives an output of the inverter 41, a control signal VPPGO, and an output of the ring oscillator 42 to perform a NAND operation, a plurality of stages of inverters connected serially to receive an output of the NAND circuit, and capacitors including ones which are provided between respective inverters and ones which are provided between the NAND circuit and the inverter of an input stage. An output of the inverter 43 is inputted into one end of the capacitor 44. The other end of the capacitor 44 is connected to a node PMP. The source of the transistor 45 and the drain of the transistor 46 are connected to the node PMP. The gate of the transistor 45 is connected to the drain of the transistor 45, which is connected to a driving voltage VCC. The gate of the transistor 46 is connected to the drain of the transistor 46, so that the power source voltage VPP is outputted from the source of the transistor 46.

Figure 5:
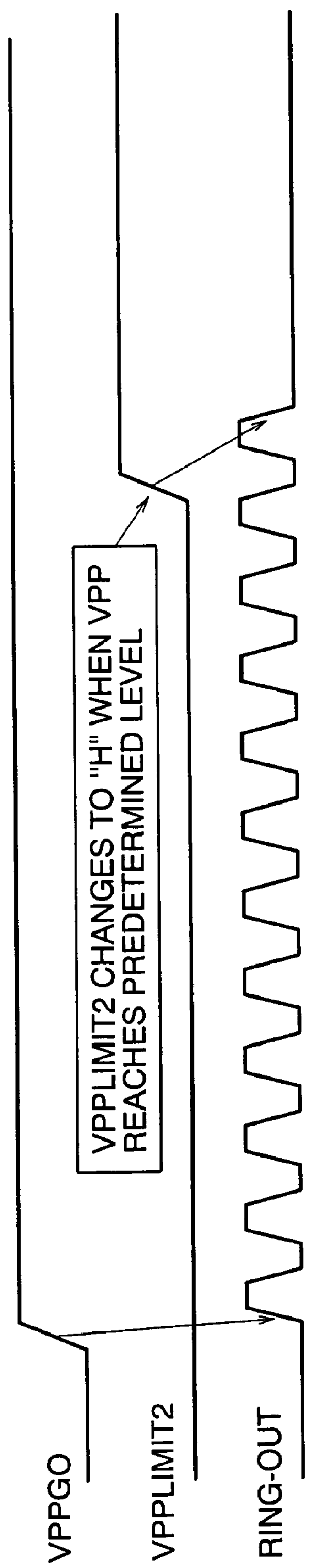
FIG. 5 is a waveform diagram for explaining an operation of the voltage boosting circuit shown in FIG. 4.

An operation of the voltage boosting circuit 40 is shown in FIG. 5. When the VPPGO signal changes to "H" level, the voltage boosting circuit 40 starts its operation, thereby outputting a pulse output RING-out from the inverter 43. While the output RING-out of the inverter 43 is in "L" level, when a threshold voltage of the transistor 45 is Vth, a potential at the node PMP is charged up to (VCC−Vth) by the transistor 45. While the pulse output RING-out is in "H" level, the node PMP is boosted up to a level of (VCC−Vth+VCC) and simultaneously charges flow into a power source line.

The voltage VPP generated from the VPP generating circuit 4 is used for driving word lines, the voltage VBLH generated from the VBLH generating circuit 6 is a potential indicating "H" level of a bit line, and the voltage VBB generated from the VBB generating circuit 8 is used as a substrate potential.

The VREF generating circuit 2 generates a reference voltage VREF when power source voltages VCC and VSS are applied to the semiconductor chip. The VCCON signal generating circuit 10 outputs a signal VCCON which changes to "H" level when the power source voltages VCC and VSS are applied to the semiconductor chip and the power source voltage VCC reaches a predetermined level (for example, 1.5V). The VREF timer 12 operates based upon the VCCON signal and outputs a signal VPPGO which changes to "H" level when the level of the reference voltage VREF becomes stable.

Figure 6:
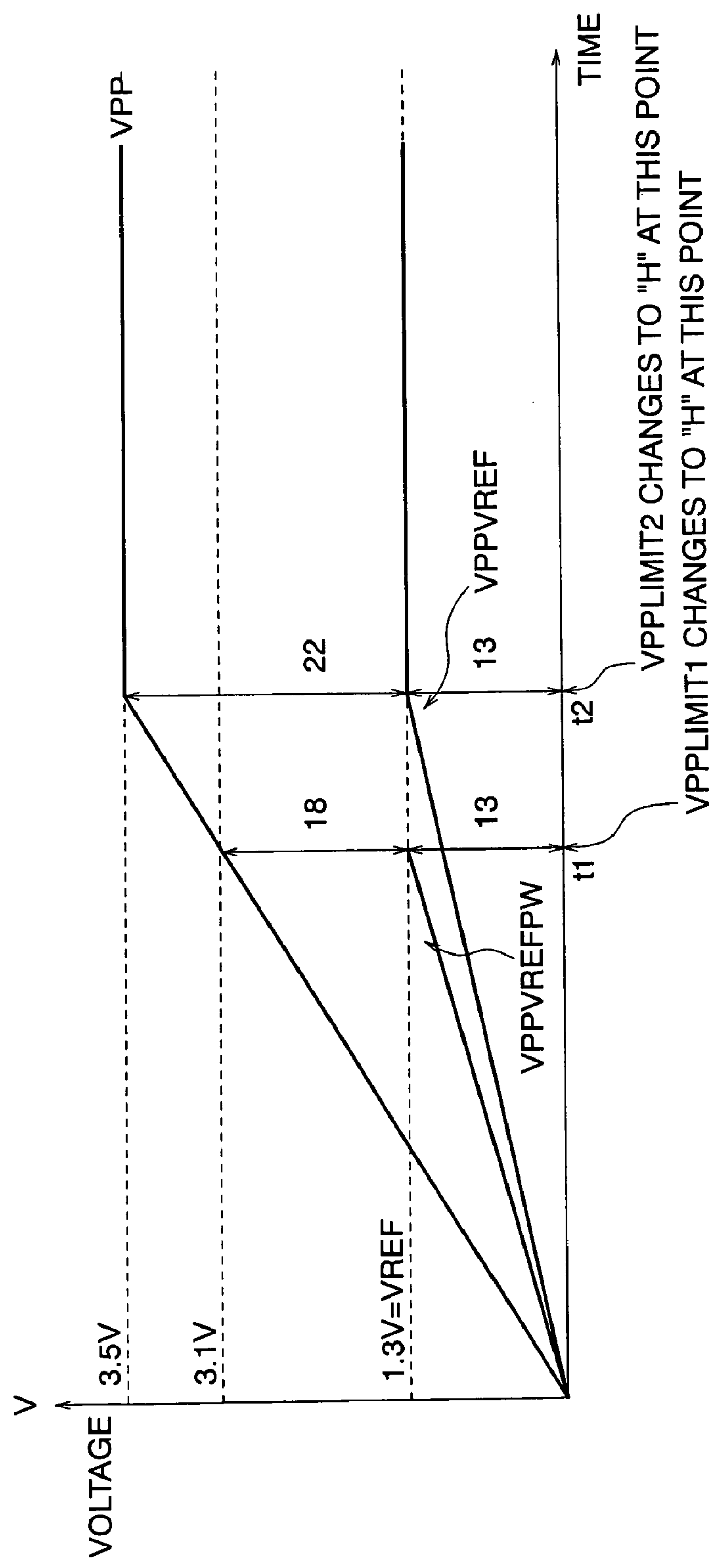
FIG. 6 is a graph for explaining an operation of the level determining circuit according to the first embodiment.

Next, an operation of the VPP generating circuit 4 will be explained with reference to FIG. 6.

When the power source voltages VCC and VSS are applied to the semiconductor chip externally, the voltage VCC rises and the reference voltage VREF also rises. At this time, the voltage VPP also rises. When the reference voltage reaches the predetermined value (1.3V), a signal VPPGO changing to "H" level is outputted from the VREF timer 12 so that the voltage boosting circuit 4*a* starts an voltage boosting operation and the voltage VPP rises. As shown in FIG. 6, when the voltage VPP reaches, for example, 3.1V at time to, the level of the signal VPPVREFPW inputted into the current mirror circuit 34 of the level determining circuit 30 for a control circuit becomes 3.1V×13/(13+18)=1.3V and therefore becomes equal to the reference voltage VREF (1.3V). As a result, a control signal VPPLIMIT1 with "H" level is outputted from the level determining circuit 30 for a control circuit to be fed into the control circuit 14. Thereby, the control circuit 14 starts operation thereof.

On the other hand, the voltage VPPVREF inputted into the current mirror circuit 24 of the level determining circuit 20 for a voltage boosting circuit also rises according to rising of the voltage VPR When the level of the voltage VPP reaches 3.5V, the potential VPPVREF becomes 3.5V×13/(13+22)=1.3V and therefore becomes equal to the reference voltage VREF. As a result, a control signal VPPLIMIT2 changed to "H" level is outputted from the level determining circuit 30 for a voltage boosting circuit so that the voltage boosting action of the voltage boosting circuit 4*a* is stopped.

Thus, when the control signal VPPLIMIT1 generated from the VPP generating circuit 4 changes to "H" level, because the VPPGO signal is also in "H" level, the control circuit 14 operates to feed the control signal VBLHGO whose level has changed to "H" to the VBLH generating circuit 6 and the control circuit 16, as shown in FIG. 2.

When being inputted with the control signal VBLHGO whose level has changed to "H", as shown in FIG. 2, the VBLH generating circuit 6 operates to generate a voltage VBLH. When the voltage VBLH reaches the expected value, a control signal VBLHLIMIT generated from the VBLH generating circuit changes to "H" level. As a result, the control circuit 16 operates to change the level of the control signal VBBGO from "L" level to "H" level. The control signal VBBGO whose level has changed to "H" is fed to the VBB generating circuit 8 and the control circuit 18. The VBB generating circuit 8 operates based upon the control signal VBBGO whose level has changed to "H" to generate a voltage VBB. When the voltage VBB reaches the expected value, the control signal VBBLIMIT fed from the VBB generating circuit 8 to the control circuit 18 changes to "H" level, and the control circuit 18 operates to output a control signal CHRDY indicating completion of preparation of the semiconductor chip.

As explained above, according to this embodiment, two expected values for a control circuit and for a voltage boosting circuit are provided for the level determining circuit 4*b*, and the expected value for a control circuit is set to be lower than that for a voltage boosting circuit. Therefore, even when the reference voltage VREF rises due to a manufacturing process, the control circuit 14 can operate so that a sufficient operation margin can be secured for evaluation for the allowable minimum value VCCmin. Thereby, it is made possible to evaluate the allowable minimum value VCCmin before performing trimming-adjustment on the VREF potential, so that increase in the number of evaluation steps and increase in manufacturing cost can be prevented.

Second Embodiment

Figure 7:
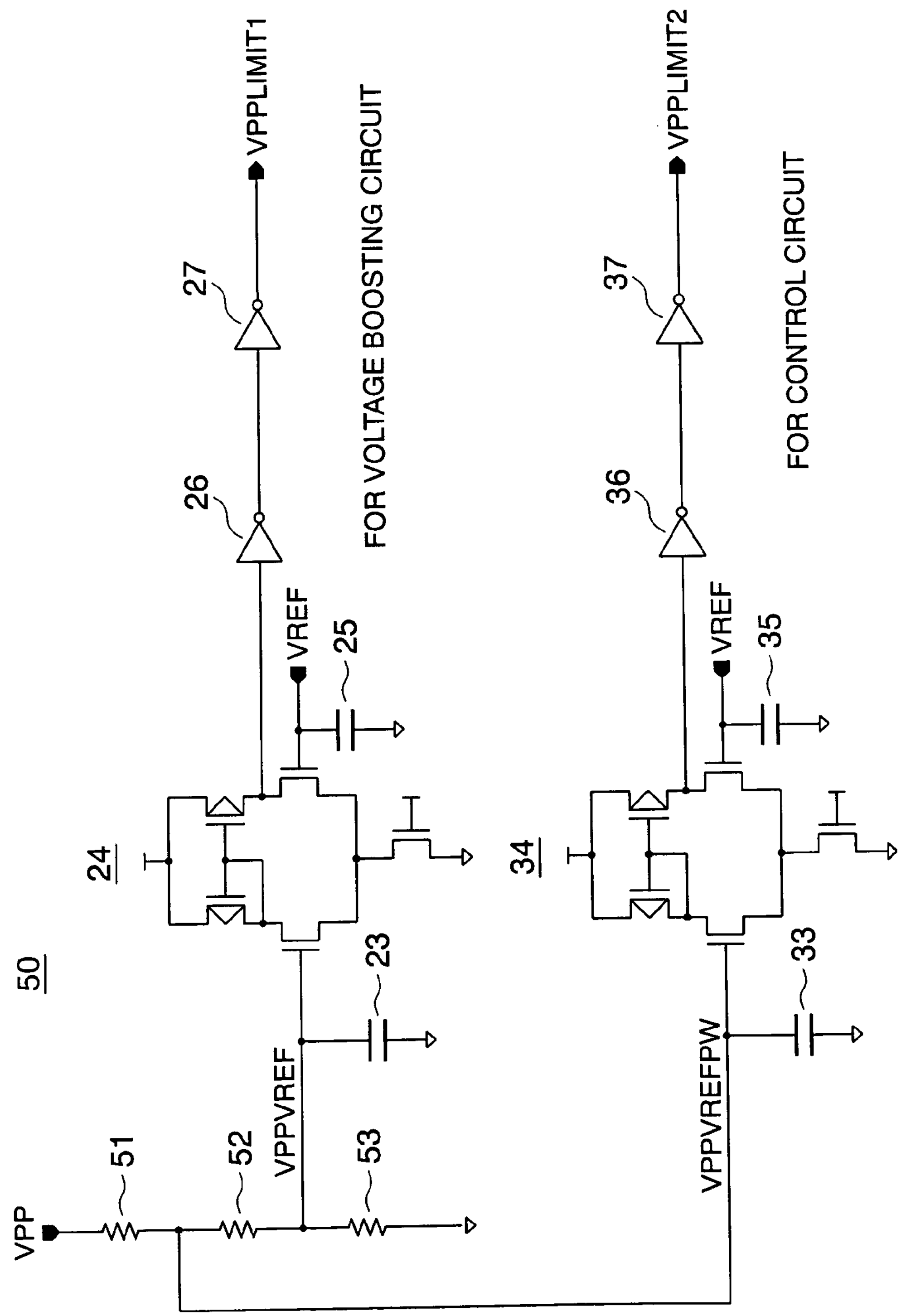
FIG. 7 is a circuit diagram showing a configuration of one specific example of a level determining circuit according to a second embodiment.

Next, a semiconductor integrated circuit device according to a second embodiment of the invention will be explained with reference to FIG. 7. A semiconductor integrated circuit device according to this embodiment has a configuration that the level determining circuits 20 and 30 in the VPP generating circuit 4 are replaced with a level determining circuit 50 shown in FIG. 7 in the semiconductor integrated circuit device of the first embodiment. The level determining circuit 50 has a configuration that the resistors 21, 22, 31, and 32 in the level determining circuits 20 and 30 shown in FIGS. 3A and 3B are replaced with resistors 51, 52, 53 connected serially. The resistance values of the resistors 51, 52, and 53 may be determined such that, for example, when the voltage VPP is 3.1V, the signal VPPVREFPW is 1.3V, or when the voltage VPP is 3.5V, the potential VPPVREF is 1.3V.

Since the resistors are shared in the embodiment, the semiconductor integrated circuit device in this embodiment can be reduced in layout size and also reduced in current consumption as compared with that in the first embodiment.

In this embodiment, even when the reference voltage VREF rises due to a manufacturing process, the control circuit 14 can operate so that a sufficient operation margin can be secured for evaluation for the allowable minimum value VCCmin like the first embodiment. Thereby, it is made possible to evaluate the allowable minimum value VCCmin before performing trimming-adjustment on the VREF potential, so that increase in the number of evaluation steps and increase in manufacturing cost can be prevented.

Third Embodiment

Next, a configuration of a semiconductor integrated circuit device according to a third embodiment of the present invention will be explained with reference to FIG. 14 to FIG. 17.

Figure 14:
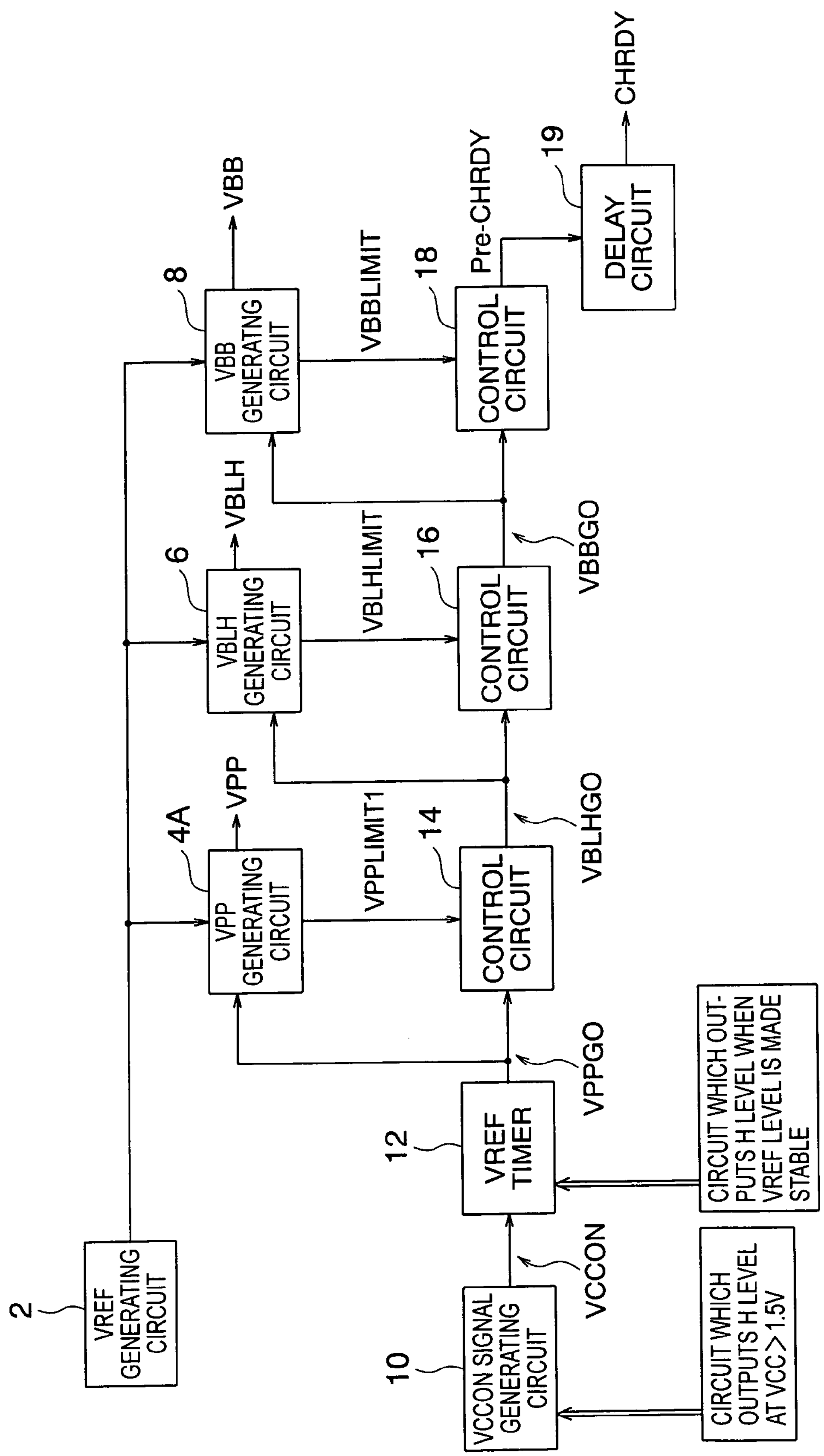
FIG. 14 is a block diagram showing a configuration of a semiconductor integrated circuit device according to a third embodiment of the invention.

A configuration of a semiconductor integrated circuit device according to the third embodiment of the present invention is shown in FIG. 14. The semiconductor integrated circuit device according to this embodiment has a configuration that the VPP generating device 4 is replaced with a VPP generating circuit 4A and a delaying circuit 19 is provided at a rear stage of the control circuit 18 in the semiconductor integrated circuit device of the second embodiment shown in FIG. 2. In this embodiment, an output of the control circuit 18 does not constitute the control signal CHRDY but an output of the delaying circuit 19 constitute the control signal CHRDY. That is, the delaying circuit 19 delays an output signal Pre-CHRDY of the control circuit 18 to use the delayed signal as the control signal CHRDY. The delaying circuit 19 changes the level of the control signal CHRDY to "H" level with a time delay corresponding to a time required from a rising of the signal Pre-CHRDY to stabilization of the voltage VPP at a desired level.

Figure 15:
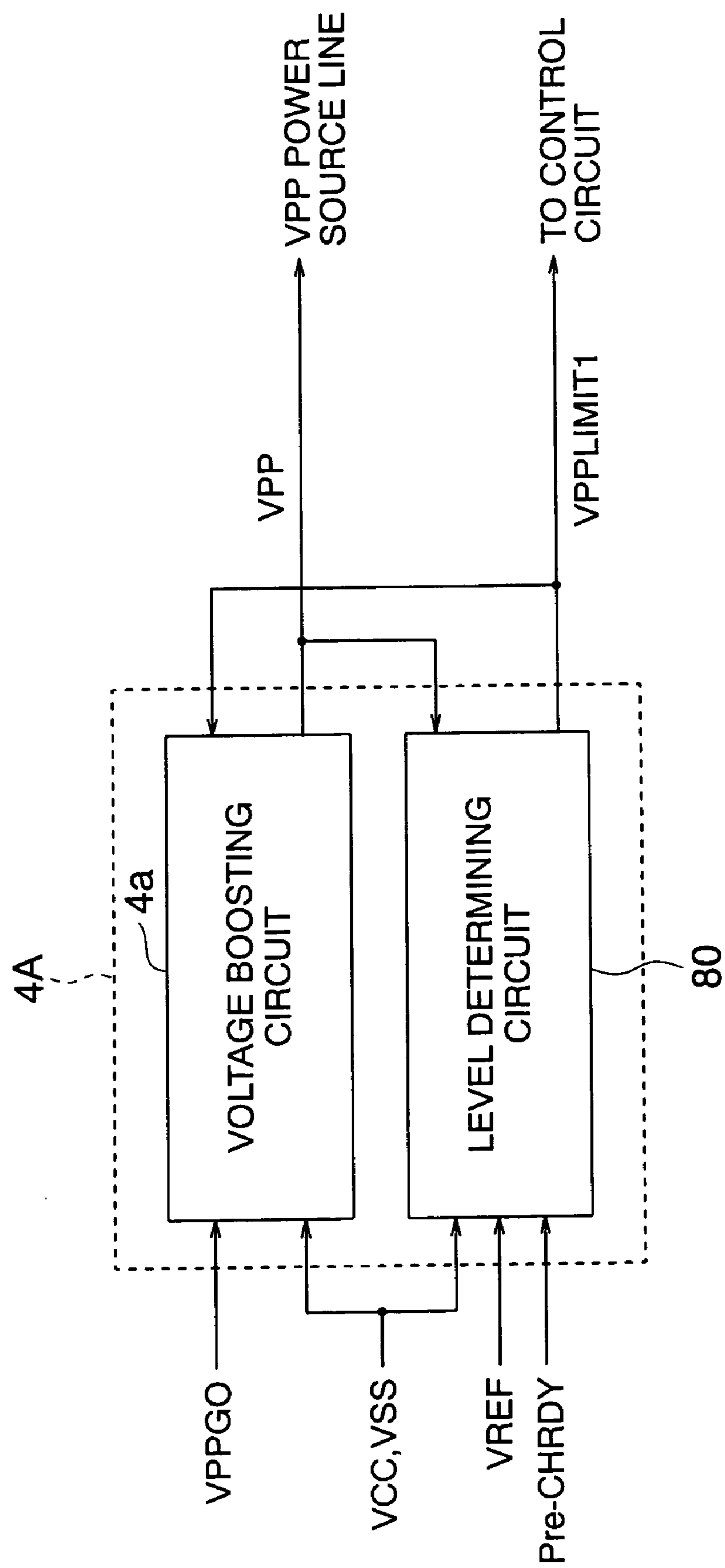
FIG. 15 is a block diagram showing a configuration of a VPP generating circuit according to the third embodiment.

A configuration of the VPP generating circuit 4A is shown in FIG. 15. As shown in FIG. 15, the VPP generating circuit 4A has a configuration that the level determining circuit 4*b* in the VPP generating circuit 4 of the first embodiment shown in FIG. 1 is replaced with a level determining circuit 80. The level determining circuit 80 outputs a control signal VPPLIMIT1 based upon the power source voltages VCC and VSS, the reference voltage VREF, the control signal Pre-CHRDY, and the output VPP of the voltage boosting circuit 4*a*. In this embodiment, the voltage boosting circuit 4*a* stops a voltage boosting operation when the level of the control signal VPPLIMIT1 changes from "L" to "H".

Figure 16:
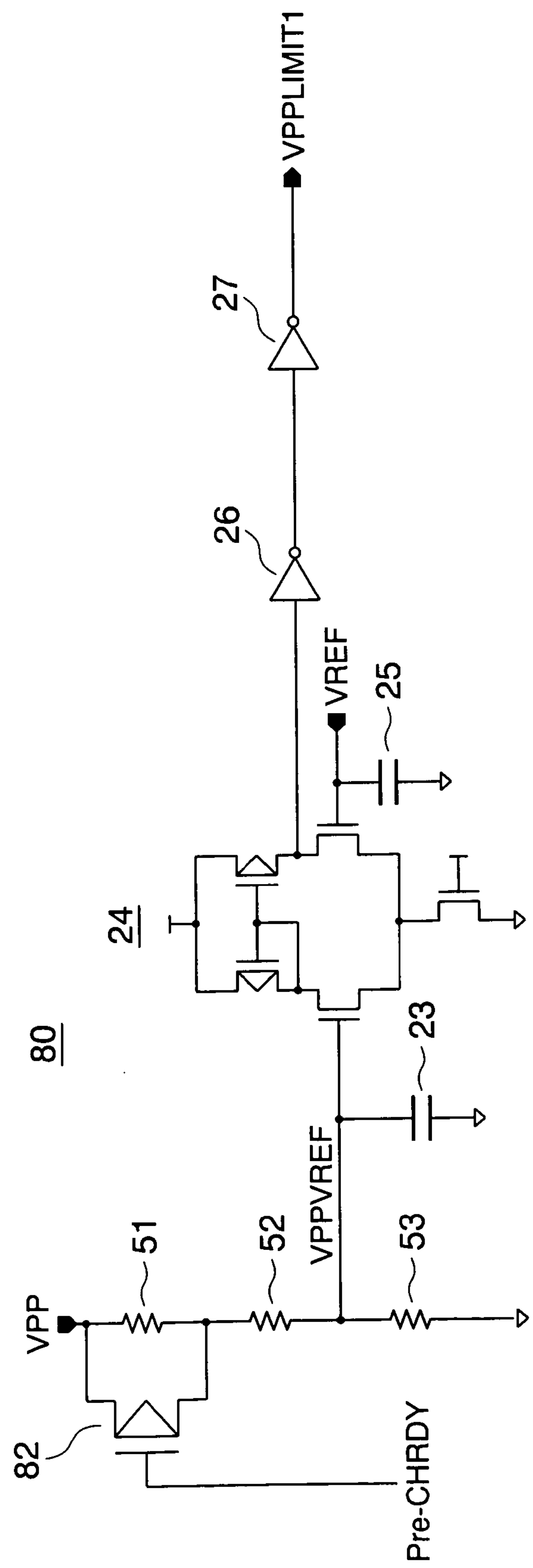
FIG. 16 is a circuit diagram showing a configuration of one specific example of a level determining circuit according to the third embodiment.

A configuration of one specific example of the level determining circuit 80 is shown in FIG. 16. The level determining circuit 80 has a configuration that the level determining circuit for a control circuit is removed by integrating the level determining circuit for a voltage boosting circuit and the level determining circuit for a control circuit common in one member and a P-channel transistor 82 is newly provided in the level determining circuit 50 according to the second embodiment shown in FIG. 7. The transistor 82 is connected to the resistor 51 in parallel thereto, and a control signal Pre-CHRDY is received at the gate of the transistor 82.

Figure 17:
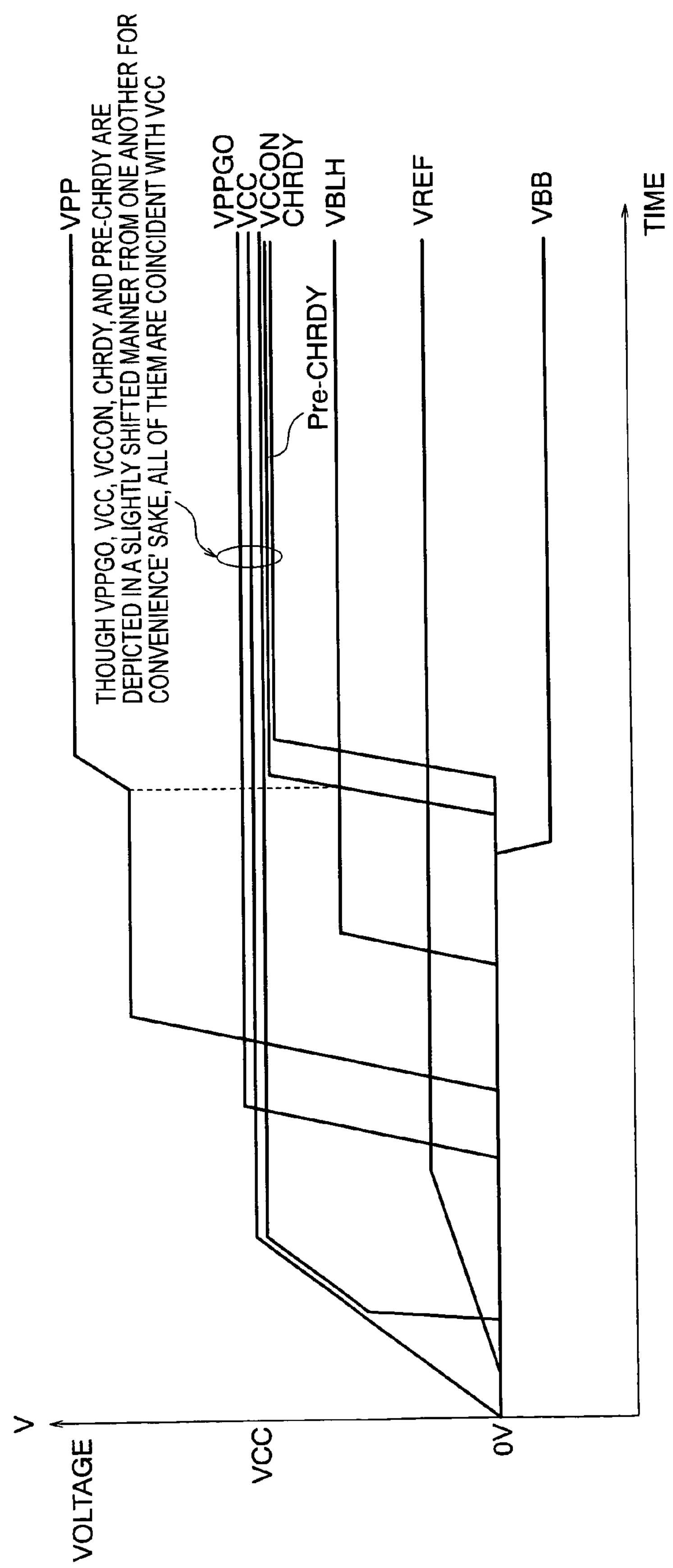
FIG. 17 is a waveform diagram for explaining an operation of the semiconductor integrated circuit device according to the third embodiment.

Next, an operation of the embodiment will be explained with reference to FIG. 17. FIG. 17 is a timing chart showing an operation of the semiconductor integrated circuit device of this embodiment.

As shown in FIG. 14, since the control signal Pre-CHRDY is an output of the control circuit 18, it changes from "L" level to "H" level after the output signal VBBLIMIT of the VBB generating circuit 8 changes to "H" level, that is, after the voltage VBB reaches a desired level. Therefore, the P-channel transistor 82 of the level determining circuit 80 in the VPP generating circuit 4A is kept ON until the control signal Pre-CHRDY changes to "H" level, thereby making the divided voltage VPPVREF of the level determining circuit 80 higher than those in the first and second embodiments. Accordingly, the control signal VPPLIMIT1 which is an output of the level determining circuit 80 changes to "H" level before the voltage VPP generated from the VPP generating circuit 4A reaches a desired level (for example, 3.5V) and stops an operation of the voltage boosting circuit 4*a,* which is different from the cases in the first and second embodiments. For this reason, as shown in FIG. 17, the voltage VPP generated from the VPP generating circuit 4A reaches a constant voltage (for example, 3.1V) until it reaches the desired level (for example, 3.5V). In the first and second embodiments, the voltage VPP continues to rise until it reaches the desired level (for example, 3.5V).

When the voltage VPP is in a level state of the constant voltage, after the voltage VBB reaches the desired level, the control signal Pre-CHRDY changes from "L" level to "H" level, so that the P-channel transistor 82 in the level determining circuit 80 is turned OFF. Consequently, the divided voltage VPPVREF in the level determining circuit 80 drops and the control signal VPPLIMIT1 changes from "H" level to "L" level. Thereby, the voltage boosting circuit 4*a* in the VPP generating circuit 4A operates again to start a voltage boosting action. When the control signal VPPLIMIT1 changes to "H" level, namely, when the voltage VPP generated from the VPP generating circuit 4A reaches a desired level (for example, 3.5V), the voltage boosting circuit 4*a* stops its voltage boosting action so that the voltage VPP generated from the VPP generating circuit 4A is maintained at a desired value (for example, 3.5V).

Figure 11:
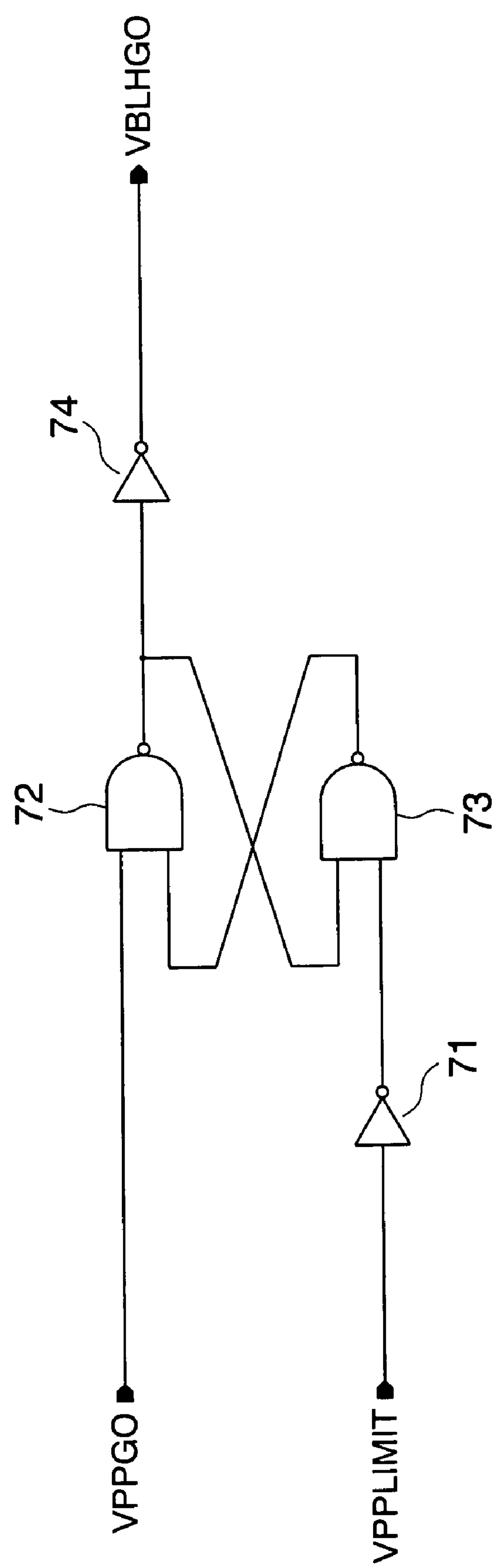
FIG. 11 is a circuit diagram showing a configuration of a control circuit.
Figure 12:
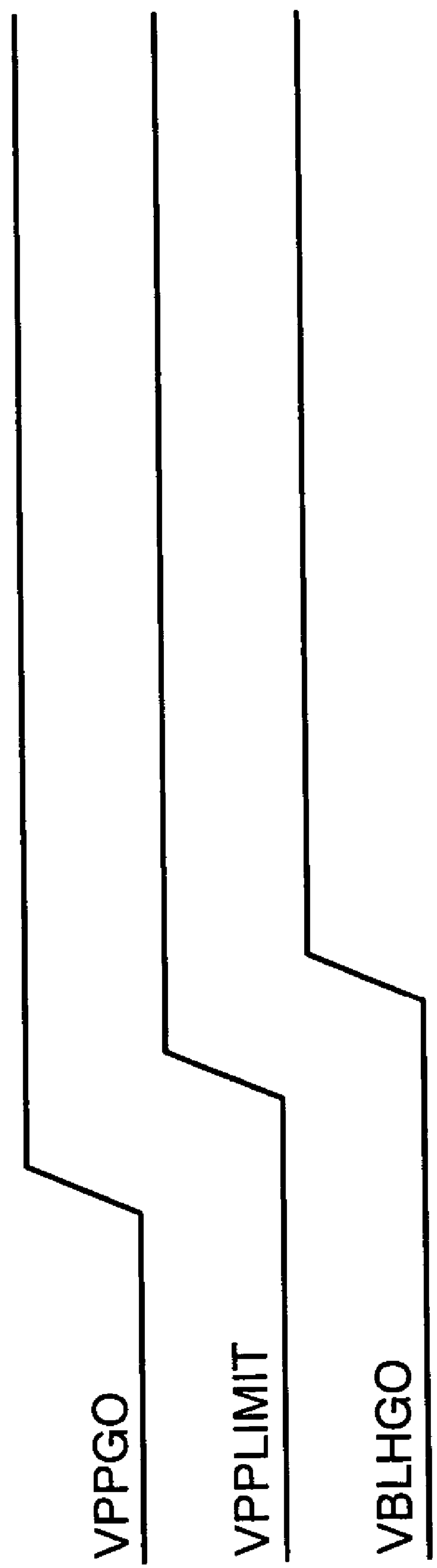
FIG. 12 is a waveform diagram for explaining an operation of the control circuit.
Figure 13:
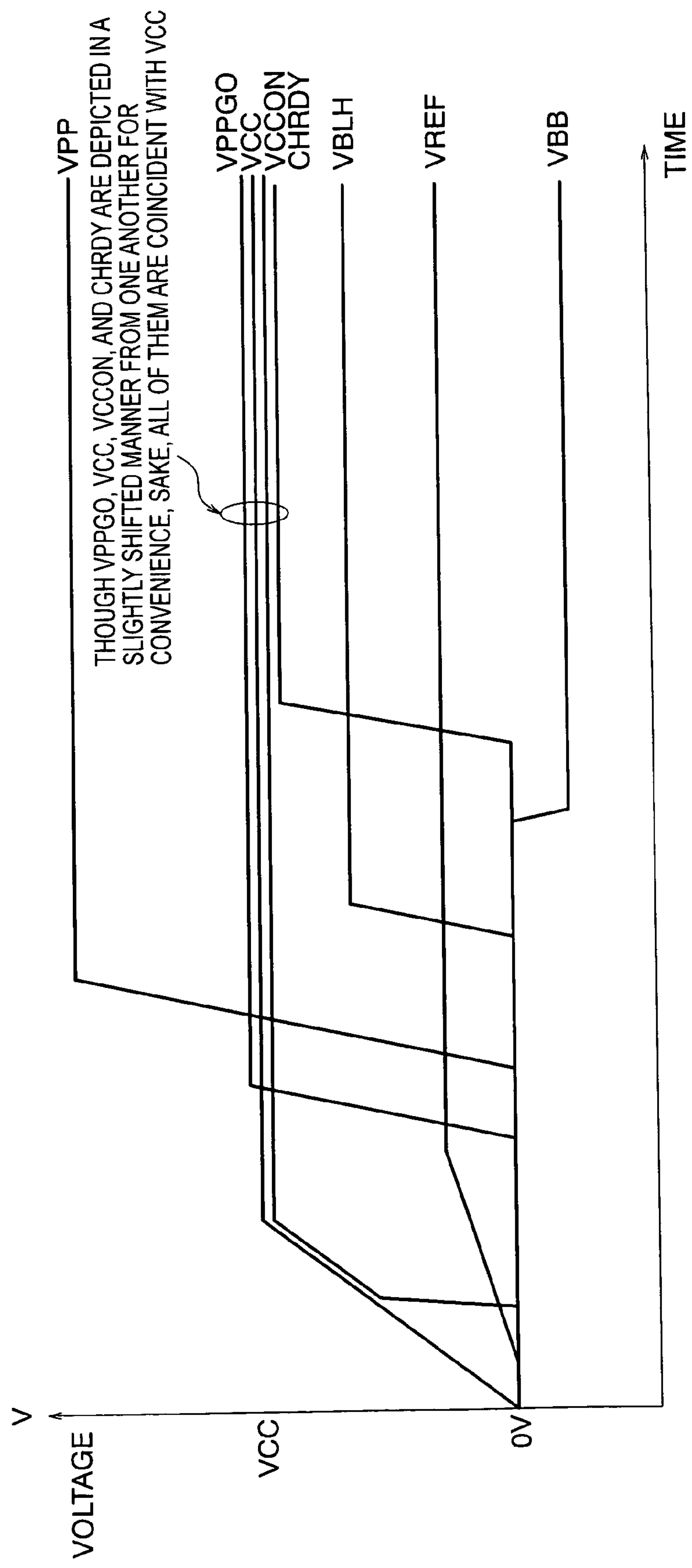
FIG. 13 is a waveform diagram for explaining an operation of the conventional semiconductor integrated circuit device.

Incidentally, since the control circuit 14 is provided with a latch circuit, for example, as shown in FIG. 11, even if the control signal VPPLIMIT1 changes to "L" level, as described above, an output signal VBLHGO does not change, so that operations of the VBLH generating circuit 6, the VBB generating circuit 8, the control circuit 16, and the control circuit 18 do not change.

In this embodiment, even when the reference voltage VREF rises due to a manufacturing process, the control circuit 14 can operate so that a sufficient operation margin can be secured for evaluation for the allowable minimum value VCCmin like the first embodiment. Thereby, it is made possible to evaluate the allowable minimum value VCCmin before performing trimming-adjustment on the VREF potential, so that increase in the number of evaluation steps and increase in manufacturing cost can be prevented.

What is claimed is:

1. A semiconductor integrated circuit device comprising:

a first internal power source voltage generating circuit which includes a voltage boosting circuit and a level determining circuit, and outputs a first internal power source voltage, the voltage boosting circuit boosting a voltage based upon a voltage boosting start instruction signal after turning on a power supply, and the level determining circuit which generates a first control signal when an output voltage from the voltage boosting circuit reaches a first level and generates a second control signal for stopping the voltage boosting of the voltage boosting circuit when the output voltage from the voltage boosting circuit reaches a second level higher than the first level;

a first control circuit which generates a first action start instruction signal based upon the voltage boosting start instruction signal and the first control signal; and a second internal power source voltage generating circuit which generates a second internal power source voltage based upon the first action start instruction signal, wherein the level determining circuit comprising:

a first voltage divider circuit which divides an output voltage of the voltage boosting circuit, a first comparing circuit which compares an output voltage of the first voltage divider circuit with a reference voltage and outputs the first control signal when the output voltage of the voltage boosting circuit reaches the first level, a second voltage divider circuit which divides the output voltage of the voltage boosting circuit, and a second comparing circuit which compares an output voltage of the second voltage divider circuit with a reference voltage and outputs the second control signal when the output voltage of the voltage boosting circuit reaches the second level.

2. A semiconductor integrated circuit device according to claim 1, wherein each of the first and second comparing circuits includes a current mirror circuit.

3. A semiconductor integrated circuit device according to claim 1, wherein the semiconductor integrated circuit device is a semiconductor memory and the second internal power source voltage is used as a driving voltage for word lines.

4. A semiconductor integrated circuit device according to claim 1, further comprising a reference voltage generating circuit which generates the reference voltage.

5. A semiconductor integrated circuit device according to claim 4, further comprising a voltage boosting start instruction signal generating circuit which generates the voltage boosting start instruction signal when the reference voltage generated from the reference voltage generating circuit is made stable at a predetermined level.

6. A semiconductor integrated circuit device according to claim 1, further comprising:

a second control circuit which generates a second action start instruction signal when a second internal power source voltage generated from the second internal power source voltage generating circuit reaches a third level;

a third internal power source voltage generating circuit which generates a third internal power source voltage based upon the second action start instruction signal; and a third control circuit which generates a third action start instruction signal when the third internal power source voltage generated from the third internal power source voltage generating circuit reaches a fourth level.

7. A semiconductor integrated circuit device according to claim 6, wherein the semiconductor integrated circuit device is a semiconductor memory, the first internal power source voltage is used as a driving voltage for word lines, the second internal power source voltage is used as a driving voltage for bit lines, the third internal power source voltage is used as a substrate potential for a semiconductor substrate, and the third action start instruction signal is a signal indicating that preparation of the semiconductor integrated circuit device after putting the power supply has been completed.

8. A semiconductor integrated circuit device comprising:

a first internal power source voltage generating circuit which includes a voltage boosting circuit and a level determining circuit, and outputs a first internal power source voltage, the voltage boosting circuit boosting a voltage based upon a voltage boosting start instruction signal after turning a power supply, and the level determining circuit which generates a first control signal when an output voltage of the voltage boosting circuit reaches a first level to stop a voltage boosting of the voltage boosting circuit;

a first control circuit which generates a first action start instruction signal based upon the voltage boosting start instruction signal;

a second internal power source voltage generating circuit which generates a second internal power source voltage based upon the first action start instruction signal;

a second control circuit which generates a second action start instruction signal when the second internal power source voltage generated from the second internal power source voltage generating circuit reaches a second level;

a third internal power source voltage generating circuit which generates a third internal power source voltage based upon the second action start instruction signal; and a third control circuit which generates a third action start instruction signal when the third internal power source voltage generated from the third internal power source voltage generating circuit reaches a third level.

9. A semiconductor integrated circuit device according to claim 8, wherein the level determining circuit comprises a voltage divider circuit which divides an output voltage of the voltage boosting circuit, a divided voltage adjusting circuit which raises the output voltage of the voltage divider circuit to a constant level before the third action start instruction is activated and which sets the output voltage of the voltage divider circuit to an original divided voltage after the third action start instruction signal is activated, and a comparing circuit which compares the output voltage of the voltage divider circuit with a reference voltage and outputs the control signal when the output voltage of the voltage divider circuit is equal to or more than the reference voltage.

10. A semiconductor integrated circuit device according to claim 9, wherein the comparing circuits includes a current mirror circuit.

11. A semiconductor integrated circuit device according to claim 8, further comprising a reference voltage generating circuit which generates the reference voltage.

12. A semiconductor integrated circuit device according to claim 11, further comprising a voltage boosting start instruction signal generating circuit which generates the voltage boosting start instruction signal when the reference voltage generated from the reference voltage generating circuit is made stable at a predetermined level.

13. A semiconductor integrated circuit device according to claim 8, further comprising a delay circuit which delays the third action start instruction signal.

14. A semiconductor integrated circuit device according to claim 13, wherein the semiconductor integrated circuit device is a semiconductor memory, the first internal power source voltage is used as a driving voltage for word lines, the second internal power source voltage is used as a driving voltage for bit lines, the third internal power source voltage is used as a substrate potential for a semiconductor substrate, and an output signal of the delay circuit is a signal indicating that preparation of the semiconductor integrated circuit device after putting the power supply has been completed.

* * * * *